(12) United States Patent
Tanaka et al.

(10) Patent No.: US 11,322,271 B2
(45) Date of Patent: May 3, 2022

(54) WIRE HARNESS WITH PROTECTOR

(71) Applicant: SUMITOMO WIRING SYSTEMS, LTD., Yokkaichi (JP)

(72) Inventors: Yuji Tanaka, Yokkaichi (JP); Yoshihide Koshino, Yokkaichi (JP)

(73) Assignee: SUMITOMO WIRING SYSTEMS, LTD., Mie (JP)

( * ) Notice: Subject to any disclaimer, the term of this patent is extended or adjusted under 35 U.S.C. 154(b) by 0 days.

(21) Appl. No.: 17/081,674

(22) Filed: Oct. 27, 2020

(65) Prior Publication Data

US 2021/0134482 A1    May 6, 2021

(30) Foreign Application Priority Data

Oct. 31, 2019    (JP) .............................. JP2019-198926

(51) Int. Cl.
| | |
|---|---|
| H01F 17/06 | (2006.01) |
| H01B 7/00 | (2006.01) |
| B60R 16/02 | (2006.01) |
| H05K 9/00 | (2006.01) |

(52) U.S. Cl.
CPC ....... H01B 7/0045 (2013.01); B60R 16/0215 (2013.01); H01F 17/06 (2013.01); H05K 9/0098 (2013.01); H01F 2017/065 (2013.01)

(58) Field of Classification Search
CPC ... H01B 7/0045; B60R 16/0215; H01F 17/06; H01F 2017/065; H05K 9/0098
USPC ...................................................... 174/72 A
See application file for complete search history.

(56) References Cited

U.S. PATENT DOCUMENTS

| | | | | |
|---|---|---|---|---|
| 6,633,000 | B2 * | 10/2003 | Kuo ..................... | H05K 9/0066 174/92 |
| 7,211,724 | B2 * | 5/2007 | Kobayashi ............. | H01F 17/06 174/92 |
| 9,258,933 | B2 * | 2/2016 | Imahori ................... | H04B 3/36 |
| 9,345,179 | B2 | 5/2016 | Imahori et al. | |
| 10,023,136 | B2 * | 7/2018 | Oka ...................... | H01B 7/0063 |
| 2015/0288162 | A1 * | 10/2015 | Imahori ............... | H02G 15/046 174/72 A |
| 2015/0289420 | A1 * | 10/2015 | Imahori ............... | H05K 9/0098 174/350 |
| 2015/0289423 | A1 * | 10/2015 | Imahori ................. | H01F 17/06 307/10.1 |
| 2016/0284440 | A1 * | 9/2016 | Adachi ............... | B60R 16/0215 |

FOREIGN PATENT DOCUMENTS

JP    2014-130886 A    7/2014

* cited by examiner

*Primary Examiner* — Timothy J Thompson
*Assistant Examiner* — Michael F McAllister
(74) *Attorney, Agent, or Firm* — Oliff PLC

(57) ABSTRACT

A wire harness including: a wire; a cover that covers an outer circumference of a portion of the wire in a length direction thereof; an electromagnetic wave absorber mounted on an outer circumference of the cover; and a fixing member that fixes one end of the cover in a length direction thereof to the wire, wherein: the electromagnetic wave absorber includes a ring-shaped magnetic substance core, and a ring-shaped case in which the magnetic substance core is housed, the cover includes a first latch formed on an outer circumferential surface of the cover, and the case includes a second latch that latches to the first latch in the length direction of the cover.

9 Claims, 7 Drawing Sheets

WIRE HARNESS WITH PROTECTOR

BACKGROUND

The present disclosure relates to a wire harness.

Conventionally, as a wire harness installed in vehicles such as a hybrid vehicle and an electric automobile, a wire harness is known that includes a wire that electrically connects a plurality of electric devices to each other, and an electromagnetic wave absorption member that absorbs the electromagnetic waves (electromagnetic noise) emitted from the wire. In a wire harness of this kind, the wire is passed through a through hole of an electromagnetic wave absorption member made of a ferrite core or the like, whereby the electromagnetic wave absorption member is mounted on the outer circumference of the wire (see, e.g. JP 2014-130886A). The electromagnetic wave absorption member is fixed to the wire by a tape member.

SUMMARY

However, the above-described wire harness suffers from the problem that the electromagnetic wave absorption member is positionally displaced relative to the wire until the electromagnetic wave absorption member is fixed to the wire by the tape member.

An exemplary aspect of the disclosure provides a wire harness that can suppress positional displacement of an electromagnetic wave absorption member.

A wire harness according to an exemplary aspect includes: a wire; a cover that covers an outer circumference of a portion of the wire in a length direction thereof; an electromagnetic wave absorber mounted on an outer circumference of the cover; and a fixing member that fixes one end of the cover in a length direction thereof to the wire, wherein: the electromagnetic wave absorber includes a ring-shaped magnetic substance core, and a ring-shaped case in which the magnetic substance core is housed, the cover includes a first latch formed on an outer circumferential surface of the cover, and the case includes a second latch that latches to the first latch in the length direction of the cover.

With the wire harness according to the present disclosure, it is possible to achieve the effect of suppressing positional displacement of the electromagnetic wave absorber.

DETAILED DESCRIPTION OF EMBODIMENTS

Figure 1:
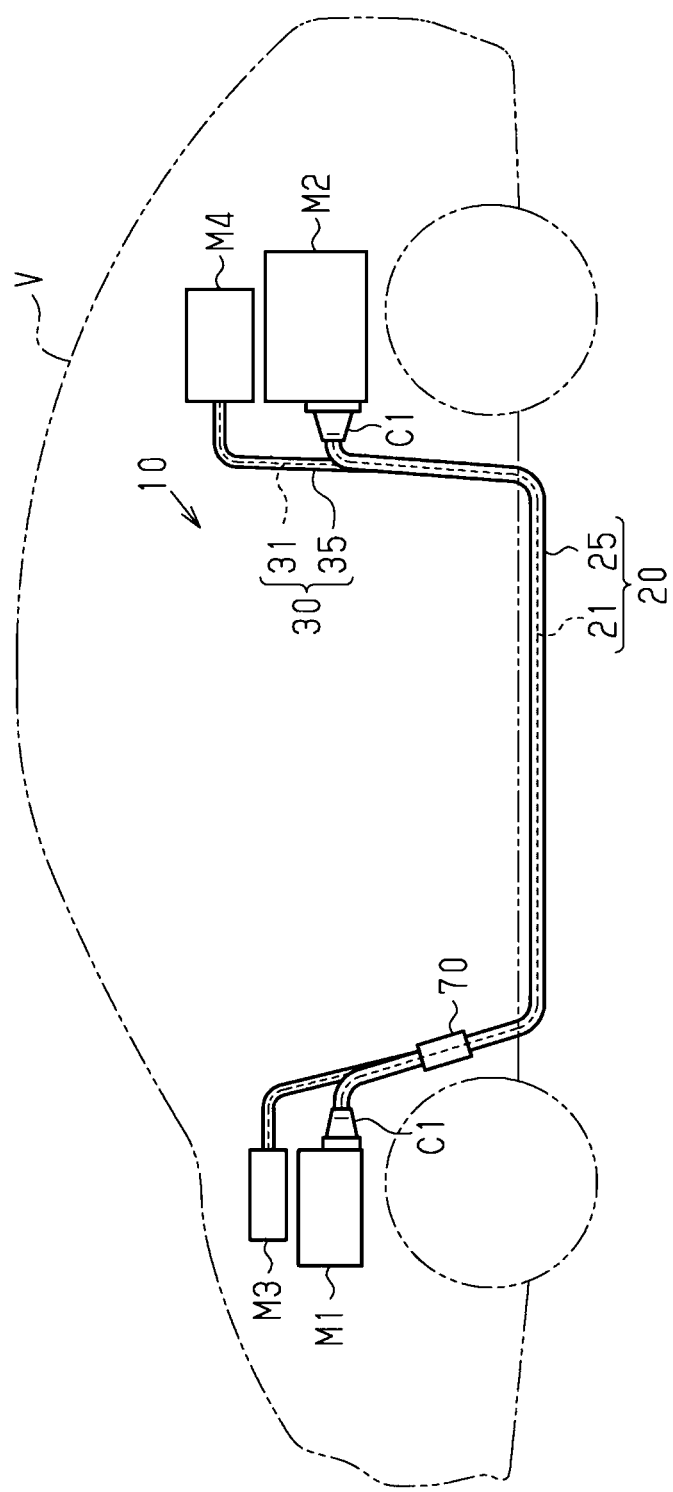
FIG. 1 is a diagram illustrating a schematic configuration of a wire harness according to an embodiment.

Description of Embodiments of the Present Disclosure

First, embodiments of the present disclosure will be listed and described.

[1] According to the present disclosure, a wire harness includes: a wire; a covering member that covers an outer circumference of a portion of the wire in a length direction thereof; an electromagnetic wave absorption member mounted on an outer circumference of the covering member; and a fixing member that fixes one end portion of the covering member in a length direction thereof to the wire, wherein the electromagnetic wave absorption member includes a ring-shaped magnetic substance core, and a ring-shaped case in which the magnetic substance core is housed, the covering member includes a first latching portion formed on an outer circumferential surface of the covering member, and the case includes a second latching portion that latches to the first latching portion in the length direction of the covering member.

With this configuration, as a result of the first latching portion of the covering member latching to the second latching portion of the case of the electromagnetic wave absorption member, it is possible to suppress the electromagnetic wave absorption member from moving in the length direction of the covering member. Thus, it is possible to suppress positional displacement of the electromagnetic wave absorption member in the length direction of the covering member.

Also, since the electromagnetic wave absorption member is mounted on the outer circumference of the covering member that covers the outer circumference of the wire, the covering member is interposed between the wire and the electromagnetic wave absorption member. Thus, it is possible to prevent the electromagnetic wave absorption member from coming into direct contact with the outer circumferential surface of the wire. This can prevent the wire from being damaged due to coming into contact with the electromagnetic wave absorption member.

Furthermore, since the covering member is provided only in a portion of the wire in the length direction, it is possible to reduce the length of the covering member compared to a case where the covering member is provided over the entire length of the wire in the length direction. Thus, it is possible to reduce the cost of the covering member, and improve the workability when the covering member is attached to the wire.

Here, "ring" as used in the present specification includes circular rings having a circular outer edge, rings having an ellipsoidal or oval outer edge, polygonal rings having a polygonal outer edge, and rings having a rounded-corner polygonal outer edge, and refers to a shape constituted by any closed shape in which outer edges are connected to each other with a straight line or a curved line. The "ring" is a shape having a through hole in a plan view, and includes rings in which the outer edge shape and the inner circumferential shape of the through hole are the same, and rings in which the outer edge shape and the inner circumferential shape of the through hole are different. The "ring" includes rings having a predetermined length extending in the direction in which the through hole passes, and there is no limitation with respect to the size of the length. In addition, "ring shape" as used in the present specification may be any shape that can be regarded as a ring as a whole, and includes ring shapes having a cut-out portion or the like in its part, such as a C-shape.

[2] Preferably, the wire harness further includes a protector in which the wire is housed, wherein the protector includes a housing portion in which the electromagnetic wave absorption member is housed.

With this configuration, the electromagnetic wave absorption member is housed in the protector. Accordingly, the electromagnetic wave absorption member can be held by the protector. This can suppress the electromagnetic wave absorption member from vibrating due to, for example, a vibration caused by the vehicle traveling, or the like. As a result, it is possible to suppress the damage of the wire that may be caused by the vibration of the electromagnetic wave absorption member.

[3] Preferably, the housing portion includes a first wall portion and a second wall portion that extend in a direction that intersects with the length direction of the wire, and are arranged at an interval in the length direction of the wire, and the first wall portion and the second wall portion are opposed to the electromagnetic wave absorption member.

With this configuration, the first wall portion and the second wall portion that are arranged at an interval in the length direction of the wire are opposed to the electromagnetic wave absorption member. Accordingly, it is possible to restrict, using the first wall portion and the second wall portion, the electromagnetic wave absorption member from moving in the length direction of the wire in the housing portion of the protector. It is thus possible to restrict the movement of the electromagnetic wave absorption member within the protector. As a result, it is possible to suppress generation of abnormal noise or damage of the electromagnetic wave absorption member that may be caused due to the electromagnetic wave absorption member and the protector coming into contact with each other.

[4] Preferably, the covering member is provided so as to pass through the first wall portion, and pass through the second wall portion. With this configuration, the wire is passed through the first wall portion while being covered by the covering member, and is passed through the second wall portion while being covered by the covering member. Accordingly, the covering member can be interposed between the outer circumferential surface of the wire, and the first wall portion, and can be interposed between the outer circumferential surface of the wire, and the second wall portion. Thus, it is possible to prevent the first wall portion and the second wall portion from coming into direct contact with the outer circumferential surface of the wire. As a result, it is possible to prevent the wire from being damaged due to coming into contact with the first wall portion and the second wall portion.

[5] Preferably, if the wire is set as a first wire, the wire harness further includes a second wire, which is different from the first wire, the protector includes a wire housing portion that is provided side by side with the housing portion, and a partition wall that separates the housing portion from the wire housing portion, the first wire is passed through the housing portion, and the second wire is passed through the wire housing portion.

With this configuration, the first wire and the electromagnetic wave absorption member mounted on this first wire are housed in the housing portion, and the second wire is housed in the wire housing portion. Accordingly, the electromagnetic wave absorption member and the second wire are separately housed in the housing portion and the wire housing portion that are separated from each other by the partition wall. Since the partition wall can be interposed between the second wire and the electromagnetic wave absorption member in this way, the electromagnetic wave absorption member can be prevented from coming into direct contact with the outer circumferential surface of the second wire. As a result, it is possible to prevent the second wire from being damaged due to coming into contact with the electromagnetic wave absorption member.

[6] Preferably, the protector further includes a collective housing portion in which the first wire and the second wire are collectively housed, the collective housing portion is adjacent to the housing portion in the length direction of the first wire, and is adjacent to the wire housing portion in a length direction of the second wire, the first wall portion is provided so as to separate the housing portion from the collective housing portion, the first wall portion includes a first through hole through which the covering member is passed, and a third wall portion coupled to the partition wall, and an inner surface of the first through hole includes a side surface of the third wall portion, and an extended surface that is formed continuously from the side surface, and extends from the side surface toward the second wall portion side in the length direction of the first wire.

With this configuration, the inner surface of the first through hole includes a side surface of the third wall portion and the extended surface. Accordingly, it is possible to make the inner surface of the first through hole larger in the surface area, relative to a case where the inner surface of the first through hole is constituted only by the side surface of the third wall portion. Accordingly, when the first wire is routed from the collective housing portion to the housing portion, the outer circumferential surface of the covering member that covers the outer circumference of this first wire can be suitably brought into areal contact with the inner surface of the first through hole. As a result, it is possible to suppress the damage of the outer circumferential surface of the covering member that may be caused by the covering member coming into contact with the inner surface of the first through hole more suitably than in a case where the inner surface of the first through hole comes into point or line contact with the outer circumferential surface of the covering member.

Here, "to collectively house" as used in the present specification means to house, for example, the first wire and the second wire without a wall provided between the first wire and the second wire.

[7] Preferably, the covering member is provided only inside the protector. With this configuration, since the covering member is provided only inside the protector, a short covering member can be realized. Thus, it is possible to reduce the cost of the covering member, and improve the workability when the covering member is attached to the wire.

[8] Preferably, the case has a transverse cross section having a polygonal shape with a number of sides equal to or greater than that of a square, the housing portion has a height set to be smaller than a diagonal dimension in the transverse cross section of the case, and the housing portion has a width set to be smaller than the diagonal dimension.

With this configuration, the housing portion is formed with a height and a width that are smaller than the diagonal dimension in the transverse cross section of the case. Accordingly, even if, in the housing portion, the case is rotated around the central axis of the case serving as an axis of rotation, the outer circumferential surface of the case can be brought into contact with the inner circumferential surface of the housing portion. Thus, it is possible to suitably suppress the rotation of the case within the housing portion. As a result, it is possible to suppress the damage of the wire that may be caused by the rotation of the case.

Here, "diagonal dimension in the transverse cross section of the case" as used in the present specification refers to the dimension of the longest one of the diagonals in the transverse cross section of the case.

[9] Preferably, the covering member is a corrugated tube having a bellows structure in which ring-shaped protrusions and ring-shaped recesses are alternately provided successively in an axial direction in which the central axis of the covering member extends, the case includes a pair of side walls provided at opposite ends of the case in an axial direction thereof, and a circumferential wall that is provided between the pair of side walls, and extends in a circumferential direction and the axial direction of the case, each of the side walls includes a through hole through which the covering member is passed, the second latching portion is formed protruding from an inner circumferential surface of the through hole inward in the radial direction of the case, and the second latching portion is fitted into the ring-shaped recess.

With this configuration, the second latching portion is formed on each of the side walls provided at the opposite ends of the case in the axial direction thereof, and this second latching portion is fitted into a ring-shaped recess of the covering member, which is a corrugated tube. Accordingly, at both opposite ends of the case in the axial direction thereof, the second latching portions can latch to the ring-shaped protrusions, and thus it is possible to suppress the electromagnetic wave absorption member from moving in the length direction of the covering member. As a result, it is possible to suppress positional displacement of the electromagnetic wave absorption member in the length direction of the covering member.

[10] Preferably, the inner circumferential surface of the through hole includes a plurality of second latching portions provided at intervals in a circumferential direction of the through hole.

With this configuration, the plurality of second latching portions are fitted into a ring-shaped recess, and the plurality of second latching portions latch to ring-shaped protrusions. Thus, it is possible to suppress the electromagnetic wave absorption member from moving in the length direction of the covering member.

Details of Embodiments of Present Disclosure

Specific examples of the wire harness according to the present disclosure will be described below with reference to the drawings. In the drawings, parts of configurations are shown exaggerated or simplified in some cases for convenience of description. Also, the constituent components may be shown with different dimensional proportions among the drawings. In the present specification, the terms "parallel" and "orthogonal" include not only a case where two objects are exactly parallel or orthogonal to each other, but also a case where the two objects are substantially parallel or orthogonal to each other within a scope in which the functions and effects of the present embodiment can be achieved. It should be noted that the present disclosure is defined by the claims without being limited to these examples, and is intended to include all modifications which fall within the scope of the claims and the meaning and scope of equivalents thereof.

Overall Configuration of Wire Harness 10

A wire harness 10 shown in FIG. 1 electrically connects two, or three or more electric devices (devices). The wire harness 10 is installed in a vehicle V such as a hybrid vehicle or an electric automobile, for example. The wire harness 10 includes an electrical conduction path 20 that electrically connects a device M1 and a device M2, an electrical conduction path 30 that electrically connects a device M3 and a device M4, and a protector 70.

The electrical conduction path 20 is routed from the device M1 to the device M2, for example, in such a manner that a portion in a length direction thereof passes under the floor of the vehicle V. As examples of the device M1 and the device M2, the device M1 is an inverter disposed in a front-side portion of the vehicle V, and the device M2 is a high-voltage battery disposed in a rear-side portion of the vehicle V relative to the device M1. The device M1 serving as an inverter is connected to, for example, a wheel driving motor (not shown), which serves as a power source for traveling the vehicle. The inverter generates AC power based on DC power of the high-voltage battery, and supplies the generated AC power to the motor. The device M2 serving as a high-voltage battery is a battery that can supply a voltage of, for example, 100 volts or greater. In other words, the electrical conduction path 20 of the present embodiment constitutes a high voltage circuit that allows high-voltage transmission between the high-voltage battery and the inverter.

The electrical conduction path 30 is routed from the device M3 to the device M4, for example, in such a manner that a portion in a length direction thereof passes under the floor of the vehicle V. As examples of the device M3 and the device M4, the device M3 is a relay box disposed in a front-side portion of the vehicle V, and the device M4 is a low-voltage battery disposed in a rear-side portion of the vehicle V. The device M3 serving as a relay box distributes the voltage supplied from the low-voltage battery to various devices installed in the vehicle V. The device M4 serving as a low-voltage battery is a battery that can supply a voltage (e. g., 12 volts) that is lower than a voltage supplied by the high-voltage battery. In other words, the electrical conduction path 30 of the present embodiment constitutes a low voltage circuit that can accommodate a low voltage supplied from the low-voltage battery.

The wire harness 10 includes, for example, a parallel route portion in which the electrical conduction path 20 and the electrical conduction path 30 are routed extending in parallel to each other, and a separate route portion in which the electrical conduction path 20 and the electrical conduction path 30 are routed extending in different directions. In the parallel route portion, the electrical conduction path 20 and the electrical conduction path 30 are provided side by side. A part of the parallel route portion in the length direction thereof is routed under the floor of the vehicle V.

Figure 2:
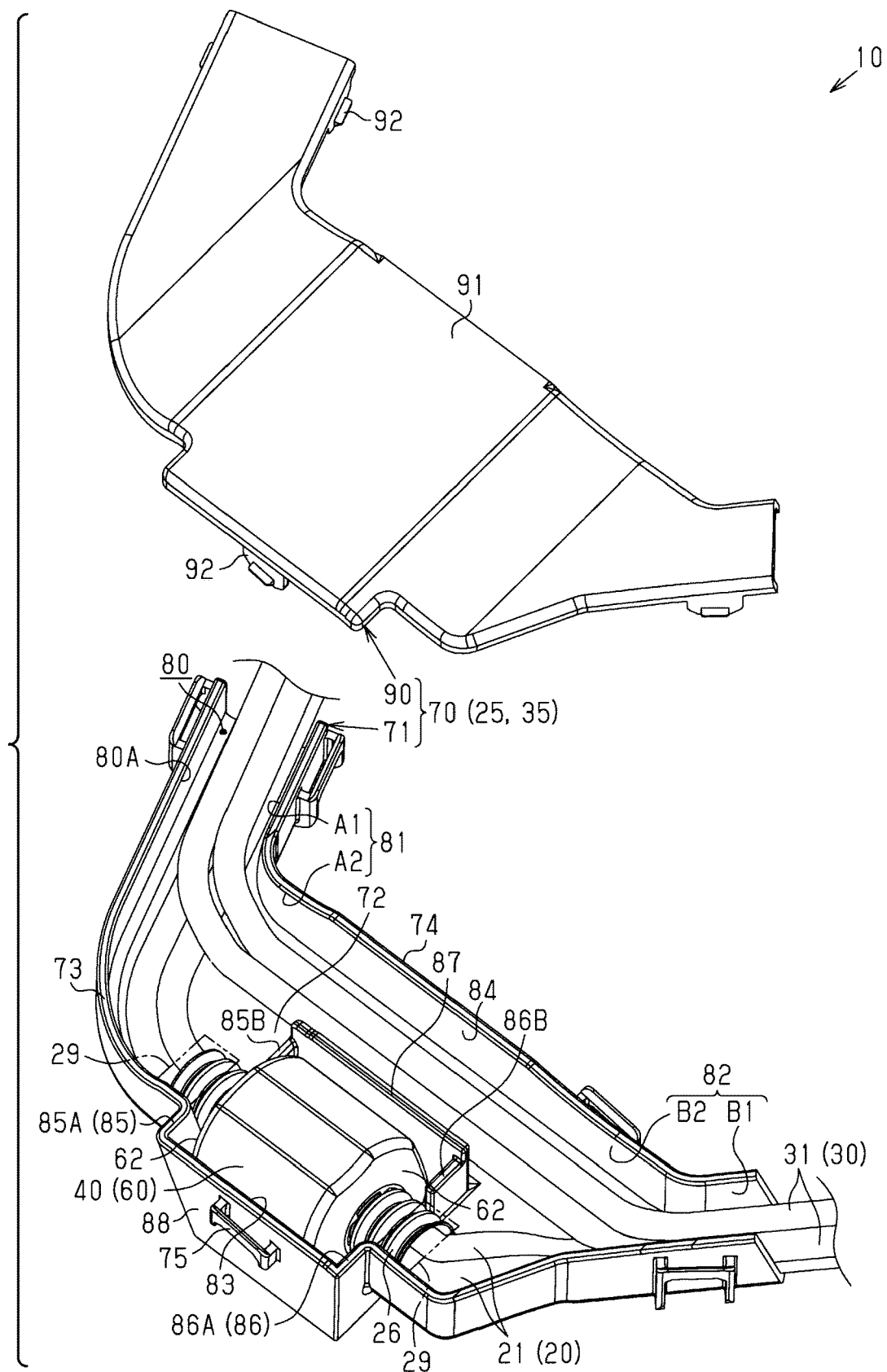
FIG. 2 is a schematic exploded perspective view illustrating the wire harness of the embodiment.
Figure 3:
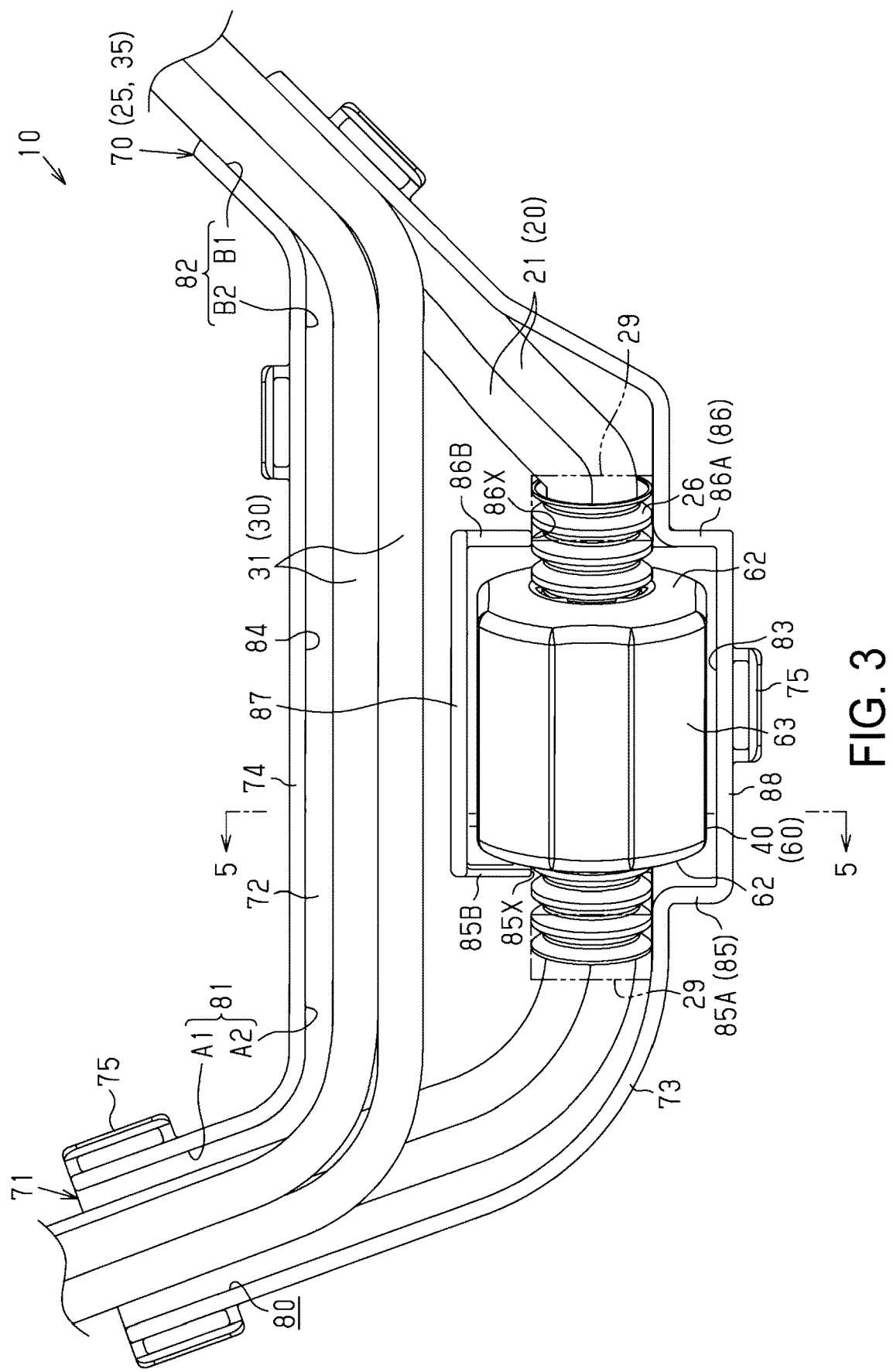
FIG. 3 is a schematic plan view illustrating the wire harness of the embodiment.

As shown in FIGS. 1 to 5, the protector 70 is provided in, for example, the parallel route portion. As shown in FIGS. 2 and 3, the protector 70 is provided so as to house a portion of the electrical conduction path 20 in the length direction, and house a portion of the electrical conduction path 30 in the length direction. The wire harness 10 includes, for example, an electromagnetic wave absorption member 40 (electromagnetic wave absorber) provided in a portion of the electrical conduction path 20 in the length direction. The electromagnetic wave absorption member 40 is housed in the protector 70, for example.

Configuration of Electrical Conduction Path 20

As shown in FIG. 1, the electrical conduction path 20 includes one or more (two in this example) wires 21, a pair of connectors C1 mounted on opposite end portions (ends) of the wires 21, and an exterior member 25 that collectively surrounds the plurality of wires 21. One end of each of the wires 21 is connected to the device M1 via the connector C1, and the other end of the wire 21 is connected to the device M2 via the connector C1. The wires 21 are formed, for example, in an elongated shape extending in the front-rear direction of the vehicle V. The wires 21 are formed so as to be two-dimensionally or three-dimensionally bendable according to the routing path of the electrical conduction path 20, for example. The wires 21 of the present embodiment are high-voltage wires capable of accommodating a high voltage and a large current. The wires 21 may be shielded wires having an electromagnetic shielding structure therein, or may be non-shielded wires having no electromagnetic shielding structure therein.

Configuration of Wire 21

Figure 5:
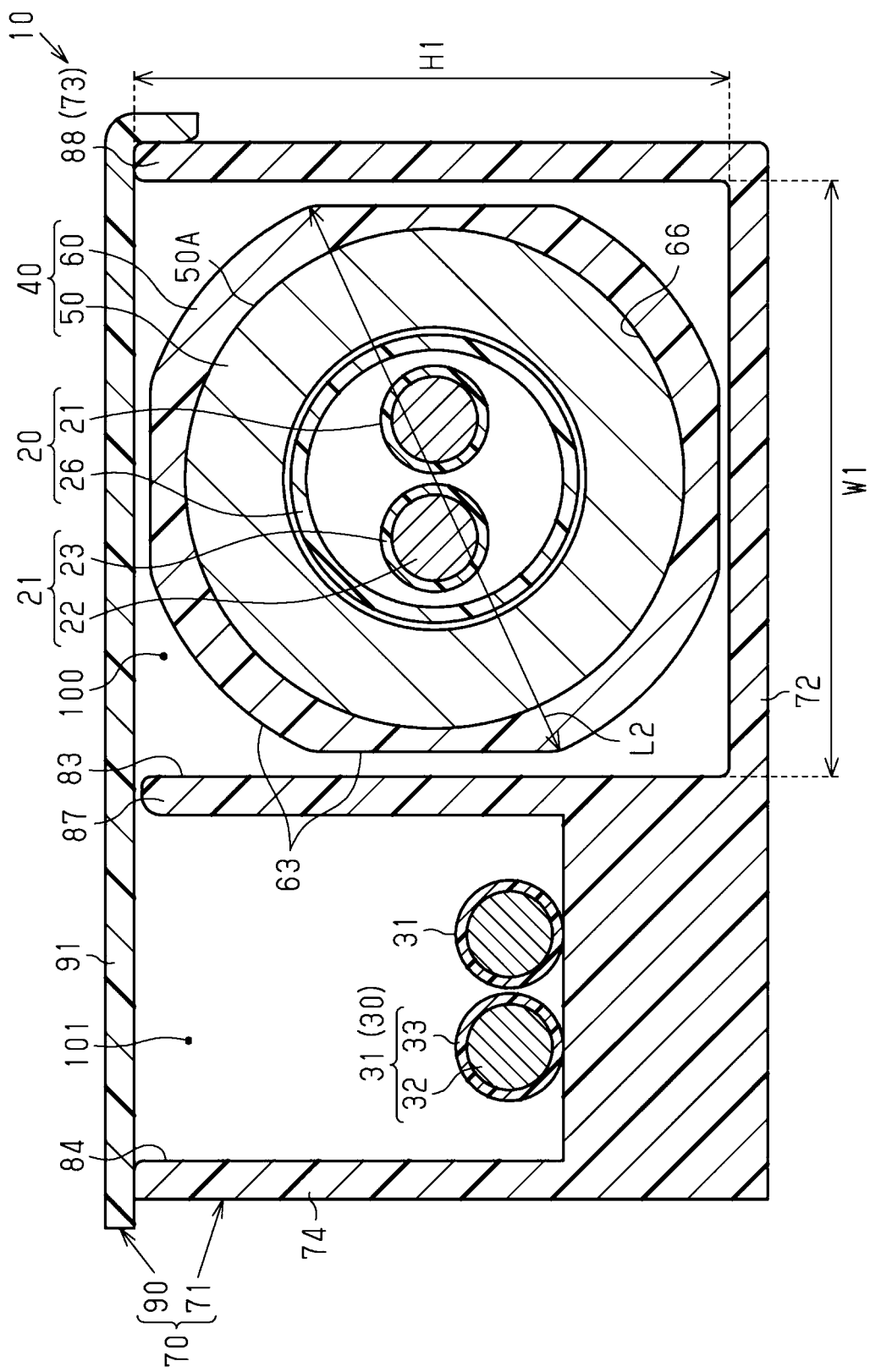
FIG. 5 is a schematic transverse cross-sectional view (cross-sectional view taken along a line 5-5 in FIG. 3) illustrating the wire harness of the embodiment.

As shown in FIG. 5, the wires 21 are covered wires including a core wire 22 made of a conductor, and an insulating covering 23 that covers the outer circumference of the core wire 22.

Configuration of Core Wire 22

As the core wire 22, it is possible to use, for example, a stranded wire formed by twisting a plurality of metal strands together, a columnar conductor formed by a single columnar metal bar having a solid internal structure, a tubular conductor having a hollow internal structure, or the like. As the core wire 22, a combination of a stranded wire, a columnar conductor, and a tubular conductor may also be used, for example. Examples of the columnar conductor include a single-core wire and a bus bar. The core wire 22 of the present embodiment is a stranded wire. As the material of the core wire 22, it is possible to use, for example, a copper-based or aluminum-based metal material.

The cross section (i.e., transverse cross section) of the core wire 22 taken along a plane orthogonal to the length direction of the core wire 22 can have any shape. The transverse cross section of the core wire 22 can have a circular shape, a semi-circular shape, a polygonal shape, a square shape, or a flat shape, for example. The transverse cross section of the core wire 22 of the present embodiment has a circular shape.

Configuration of Insulating Covering 23

The insulating covering 23 covers the outer circumferential surface of the core wire 22 throughout the circumferential direction thereof, for example. The insulating covering 23 is formed of, for example, an insulating material such as a synthetic resin. As the material of the insulating covering 23, it is possible to use, for example, a synthetic resin composed mainly of a polyolefin-based resin such as a cross-linked polyethylene or a cross-linked polypropylene. As the material of the insulating covering 23, it is possible to use one material alone, or two or more materials in an appropriate combination. The insulating covering 23 can be formed by performing extrusion molding (extrusion coating) on the core wire 22, for example.

Configuration of Exterior Member 25

The exterior member 25 shown in FIG. 1 as a whole has an elongated tubular shape. The exterior member 25 houses, in the internal space thereof, the wires 21. As the exterior member 25, it is possible to use, for example, a pipe made of a metal or a resin, a protector made of a resin, a flexible corrugated tube made of a resin or the like, a waterproofing cover made of a rubber, or a combination thereof. As the material of the pipe made of a metal, it is possible to use, for example, a copper-based, iron-based, or aluminum-based metal material. As the materials of the protector and the corrugated tube that are made of a resin, it is possible to use, for example, a conductive resin material or a non-conductive resin material. As the resin material, it is possible to use, for example, a synthetic resin such as polyolefin, polyamide, polyester, and an ABS resin.

As shown in FIGS. 2 and 3, the exterior member 25 includes, for example, a covering member 26 (cover) and the protector 70.

Configuration of Covering Member 26

For example, the covering member 26 is provided so as to cover the outer circumferences of portions of the wires 21 in the length direction. The covering member 26 is provided so as to cover portions of the wires 21 that are housed inside the protector 70, for example. The covering member 26 is provided only inside the protector 70, for example. The covering member 26 as a whole has a tubular shape that collectively surrounds the outer circumferences of the plurality of wires 21. For example, the covering member 26 has the shape of a tube whose opposite ends in the length direction of the wires 21 are open. For example, the covering member 26 is provided so as to surround the outer circumferences of the plurality of wires 21 throughout the circumferential direction thereof. The covering member 26 of the present embodiment has the shape of a circular tube. As the covering member 26, it is possible to use, for example, an exterior member that has a recess/protrusion shape (first latching portions/first latch) in the outer circumferential surface thereof. The covering member 26 of the present embodiment is a corrugated tube made of a synthetic resin.

In the following description, when a direction is simply referred to as "length direction", it means the direction in which the central axes of the wires 21 extend. When a direction is simply referred to as "circumferential direction", it means the circumferential direction of the central axes of the wires 21.

Figure 6:
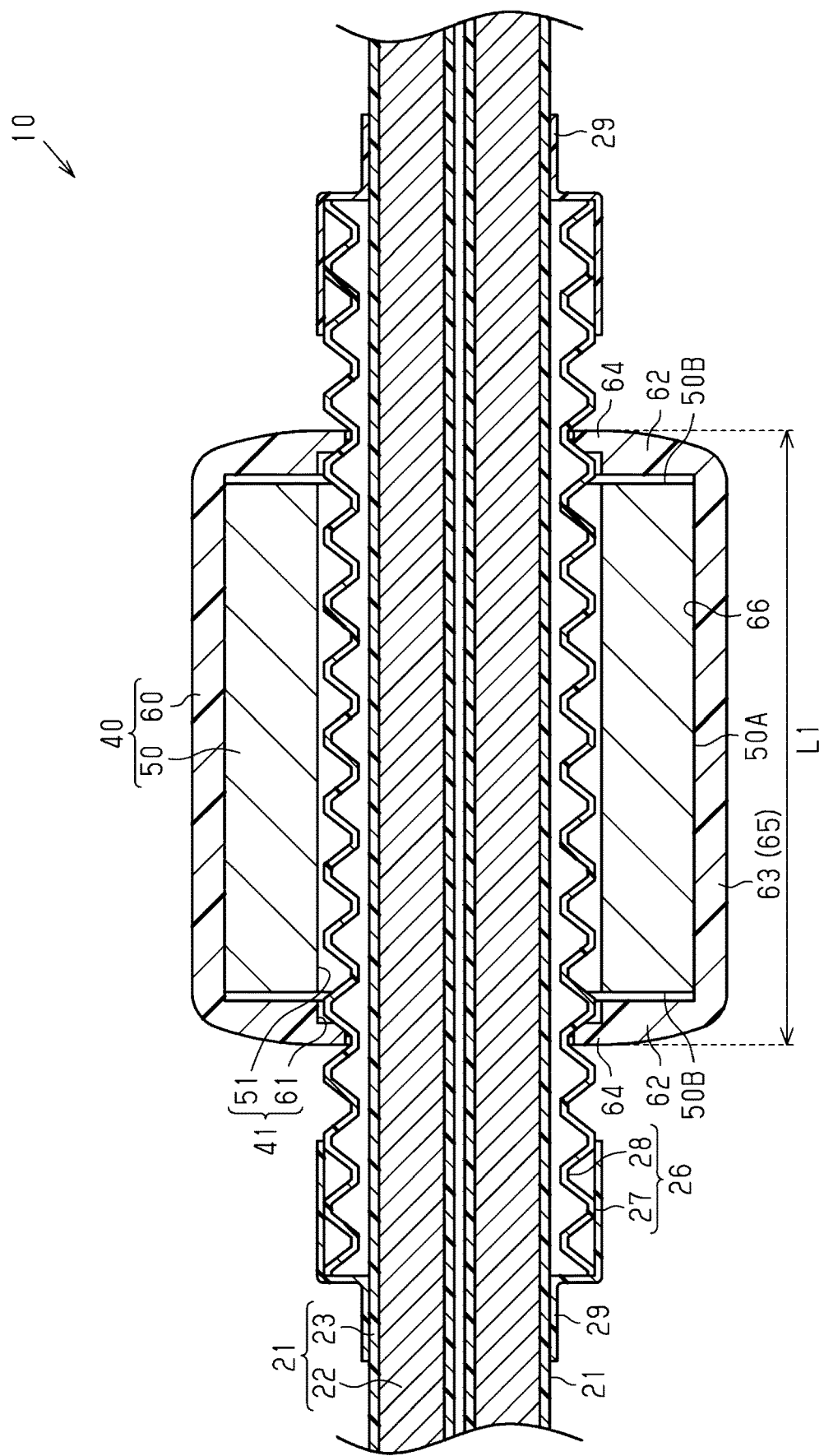
FIG. 6 is a schematic cross-sectional view illustrating the wire harness of the embodiment.

As shown in FIG. 6, the covering member 26 has, for example, a bellows structure in which ring-shaped protrusions 27 and ring-shaped recesses 28 are alternately provided successively in an axial direction (length direction) in which the central axis of the covering member 26 extends. As the material of the covering member 26, it is possible to use, for example, a conductive resin material or a non-conductive resin material. As the resin material, it is possible to use, for example, a synthetic resin such as polyolefin, polyamide, polyester, and an ABS resin.

For example, the covering member 26 may have a slit extending in the axial direction of the covering member 26, or may not have a slit extending in the axial direction of the covering member 26. The covering member 26 of the present embodiment does not have a slit extending in the axial direction thereof, but has a tubular shape that collectively surrounds the outer circumferences of the plurality of wires 21.

The covering member 26 is provided so as to pass through the electromagnetic wave absorption member 40 in the length direction, for example. For example, the covering member 26 is provided so as to pass through the electromagnetic wave absorption member 40 while covering the plurality of wires 21. The opposite ends of the covering member 26 in the length direction are drawn out from the electromagnetic wave absorption member 40, for example. For example, the opposite ends of the covering member 26 in the length direction are exposed from the electromagnetic wave absorption member 40. The covering member 26 is fixed to the outer circumferences of the wires 21 on two sides of the electromagnetic wave absorption member 40 in the length direction, for example. For example, the ends of the covering member 26 in the length direction are fixed to the outer circumferential surfaces of the wires 21 by respective fixing members 29 in the vicinity of the electromagnetic wave absorption member 40. For example, one end of the covering member 26 in the length direction is fixed to the outer circumferential surfaces of the wires 21 by the fixing member 29, and the other end of the covering member 26 in the length direction is fixed to the outer circumferential surfaces of the wires 21 by the fixing member 29. Since the covering member 26 is fixed to the outer circumferential surfaces of the wires 21 in this manner, it is possible to suppress the covering member 26 from being positionally displaced in the length direction of the wires 21. Note here that "vicinity" as used in the present specification means, when it is used as "in the vicinity of A", a range from an end of A to a distance (3×L1) that is three fold as large as a length L1 of the electromagnetic wave absorption member 40 in the length direction.

Configuration of Fixing Member 29

Each of the fixing members 29 is formed so as to fix an end of the covering member 26 in the length direction to the outer circumferential surfaces of the wires 21, for example. The fixing members 29 have, for example, a function of restricting movement of the covering member 26 in the length direction of the wire 21. As the fixing members 29, it is possible to use, for example, a tape member, a cable tie, a crimping band, or the like. The fixing members 29 of the present embodiment are tape members that have an adhesive layer on one surface thereof.

Each of the fixing members 29 is wrapped around the outer circumferential surface of the covering member 26 at an end in the length direction thereof, and the outer circumferential surfaces of the wires 21 exposed from the covering member 26, for example. The fixing member 29 is, for example, continuously wrapped around a region extending from the outer circumferential surface of the covering member 26 to the outer circumferential surfaces of the wires 21. The fixing members 29 have, for example, an overlap wrapping structure. "Overlap wrapping structure" as used herein refers to a structure in which the fixing member 29 is spirally wrapped so that predetermined portions of the fixing member 29 in the width direction overlap each other. As the overlap wrapping structure, for example, a half-overlap wrapping structure is preferable. "Half-overlap wrapping structure" as used herein refers to a structure in which the fixing member 29 is spirally wrapped so that portions corresponding to substantially halves of the fixing member 29 in the width direction overlap each other.

Note that, in FIG. 6, the protector 70 is not shown for ease of illustration.

Configuration of Electrical Conduction Path 30

As shown in FIG. 1, the electrical conduction path 30 includes, for example, one or more (two in this example) wires 31, and an exterior member 35 that surrounds the outer circumferences of the wires 31. For example, one end of each of the wires 31 is connected to the device M3, the other end of the wire 31 is connected to the device M4. The wires 31 are formed, for example, in an elongated shape extending in the front-rear direction of the vehicle V. The wires 31 are formed so as to be two-dimensionally or three-dimensionally bendable according to the routing path of the electrical conduction path 30, for example. The wires 31 of the present embodiment are low-voltage wires capable of accommodating a low voltage. The wires 31 may be shielded wires having an electromagnetic shielding structure therein, or may be non-shielded wires having no electromagnetic shielding structure therein.

Configuration of Wire 31

As shown in FIG. 5, the wires 31 are covered wires including a core wire 32 made of a conductor, and an insulating covering 33 that covers the outer circumference of the core wire 32.

Configuration of Core Wire 32

As the core wire 32, it is possible to use, for example, a stranded wire, a columnar conductor, a tubular conductor, or the like. As the core wire 32, a combination of a stranded wire, a columnar conductor, and a tubular conductor may also be used, for example. Examples of the columnar conductor include a single-core wire and a bus bar. The core wire 32 of the present embodiment is a stranded wire. As the material of the core wire 32, it is possible to use, for example, a copper-based or aluminum-based metal material.

The transverse cross section of the core wire 32 can have any shape. The transverse cross section of the core wire 32 can have a circular shape, a semi-circular shape, a polygonal shape, a square shape, or a flat shape, for example. The transverse cross section of the core wire 32 of the present embodiment has a circular shape.

Configuration of Insulating Covering 33

The insulating covering 33 covers the outer circumferential surface of the core wire 32 throughout the circumferential direction thereof, for example. The insulating covering 33 is formed of, for example, an insulating material such as a synthetic resin. As the material of the insulating covering 33, it is possible to use, for example, a synthetic resin composed mainly of a polyolefin-based resin such as a cross-linked polyethylene or a cross-linked polypropylene. As the material of the insulating covering 33, it is possible to use one material alone, or two or more materials in an appropriate combination. The insulating covering 33 can be formed by performing extrusion molding on the core wire 32, for example.

Configuration of Exterior Member 35

The exterior member 35 shown in FIG. 1 as a whole has an elongated tubular shape. The exterior member 35 houses, in the internal space thereof, the wires 31. As the exterior member 35, it is possible to use, for example, a pipe made of a metal or a resin, a protector made of a resin, a flexible corrugated tube made of a resin or the like, a waterproofing cover made of a rubber, or a combination thereof. The exterior member 35 includes, for example, the protector 70. The protector 70 of the present embodiment constitutes part of the exterior member 25, as well as part of the exterior member 35.

Configuration of Electromagnetic Wave Absorption Member 40

As shown in FIGS. 2 and 3, the electromagnetic wave absorption member 40 is provided in a portion of the electrical conduction path 20 in the length direction. The electromagnetic wave absorption member 40 is provided, for example, on the outer circumference of the covering member 26. For example, the electromagnetic wave absorption member 40 is provided so as to surround the outer circumference of a portion of the covering member 26 in the length direction. The electromagnetic wave absorption member 40 is provided so as to surround the outer circumference of the covering member 26 throughout the circumferential direction thereof, for example. The electromagnetic wave absorption member 40 is provided on the outer circumference of a portion of the wires 21 that is housed inside the protector 70, for example. The electromagnetic wave absorption member 40 is provided so as to collectively surround the outer circumferences of the plurality of wires 21, for example. The electromagnetic wave absorption member 40 absorbs a portion of the electromagnetic waves (electromagnetic noise) emitted from the wires 21, for example.

As shown in FIG. 6, the electromagnetic wave absorption member 40 has, for example, a through hole 41 through which the covering member 26 is passed. For example, the electromagnetic wave absorption member 40 has a ring shape by having the through hole 41. The through hole 41 is formed so as to penetrate the electromagnetic wave absorption member 40 in the length direction of the wires 21, for example. The covering member 26 is provided so as to pass through the through hole 41 while collectively surrounding the outer circumferences of the plurality of wires 21, for example.

Here, "ring" as used in the present specification includes circular rings having a circular outer edge, rings having an ellipsoidal or oval outer edge, polygonal rings having a polygonal outer edge, and rings having a rounded-corner polygonal outer edge, and refers to a shape constituted by any closed shape in which outer edges are connected to each other with a straight line or a curved line. The "ring" is a shape having a through hole in a plan view, and includes rings in which the outer edge shape and the inner circumferential shape of the through hole are the same, and rings in which the outer edge shape and the inner circumferential shape of the through hole are different. The "ring" includes rings having a predetermined length extending in the direction in which the through hole passes, and there is no limitation with respect to the size of the length. In addition, "ring shape" as used in the present specification may be any shape that can be regarded as a ring as a whole, and includes ring shapes having a cut-out portion or the like in its part, such as a C-shape. The electromagnetic wave absorption member 40 has a through hole 41 in a plan view as seen in the length direction of the wires 21, and is formed in a ring shape having a predetermined length extending in the direction in which the through hole 41 passes.

The electromagnetic wave absorption member 40 includes, for example, a magnetic substance core 50 having a ring shape, and a case 60 having a ring shape that houses the magnetic substance core 50. The magnetic substance core 50 includes a through hole 51 through which the covering member 26 is passed. The case 60 includes a through hole 61 through which the covering member 26 is passed. The through hole 51 and the through hole 61 constitute the through hole 41 of the electromagnetic wave absorption member 40.

Configuration of Magnetic Substance Core 50

The magnetic substance core 50 has a ring shape by having the through hole 51, for example. The magnetic substance core 50 has, for example, a ring shape such that its opposite ends in the length direction of the wires 21 are open. The magnetic substance core 50 of the present embodiment is formed in a circular ring shape. The through hole 51 is formed so as to penetrate the magnetic substance core 50 in the length direction, for example.

For example, the magnetic substance core 50 is disposed so as to oppose the wires 21 throughout the circumferential direction of the wires 21, thereby having the function of reducing the electromagnetic waves emitted from the wires 21. For example, the magnetic substance core 50 absorbs the electromagnetic waves emitted from the wires 21, and converts the energy of the electromagnetic waves into mechanical energy such as vibration, or thermal energy. This reduces the adverse effects exerted on devices or the like in the surroundings by the electromagnetic waves emitted from the wires 21.

Here, "oppose" as used in the present specification refers to a state in which surfaces or members are located in front of each other, and includes not only a case where they are located fully in front of each other, but also a case where they are located partially in front of each other. Also, "oppose" as used in the present specification includes both a case where two portions oppose each other with a portion other than the two portions interposed therebetween, and a case where two portions oppose each other with nothing interposed therebetween.

The magnetic substance core 50 is a molded body containing a soft magnetic material, for example. Examples of the soft magnetic material include iron (Fe), iron alloys, and ferrites. Examples of the iron alloys include a Fe-silicon (Si) alloy and a Fe-nickel (Ni) alloy. As the magnetic substance core 50, it is possible to use, for example, a ferrite core, an amorphous core, or a permalloy core. The ferrite core is made of a soft ferrite that exhibits soft magnetism, for example. Examples of the soft ferrite include a ferrite containing nickel (Ni) and zinc (Zn), and a ferrite containing manganese (Mn) and zinc (Zn). The material of the magnetic substance core 50 can be selected as appropriate according to the frequency band of the electromagnetic noise that is to be reduced, for example.

As shown in FIG. 5, the magnetic substance core 50 of the present embodiment is formed continuously throughout the circumferential direction of the magnetic substance core 50, and is formed in a closed-ring shape. That is, the magnetic substance core 50 of the present embodiment does not include a slit extending in the axial direction of the magnetic substance core 50. The magnetic substance core 50 of the present embodiment is formed by a single component. Note that, although the magnetic substance core 50 is formed by a single component in the present embodiment, a plurality of core materials may be combined to form a magnetic substance core 50 having a ring shape. For example, a pair of core materials each having a semi-circular transverse cross section may be combined to form a magnetic substance core 50 having a circular ring shape.

As shown in FIG. 6, the magnetic substance core 50 includes, for example, an outer circumferential surface 50A that extends in the circumferential direction and axial direction of the magnetic substance core 50, and a pair of side surfaces 50B that are located at opposite ends of the magnetic substance core 50 in the axial direction, and extend in the radial direction of the magnetic substance core 50. The pair of side surfaces 50B are provided, for example, between the outer circumferential surface 50A and the inner circumferential surface of the through hole 51.

Configuration of Case 60

The case 60 has a ring shape by having the through hole 61, for example. The case 60 has, for example, a ring shape such that its opposite ends in the length direction of the wires 21 are open. The through hole 61 is formed so as to penetrate in the axial direction (length direction) in which the central axis of the case 60 extends, for example. The covering member 26 is provided so as to pass through the through hole 61 while collectively surrounding the outer circumferences of the plurality of wires 21, for example. The covering member 26 of the present embodiment is provided so as to pass through the through hole 41 of the electromagnetic wave absorption member 40 that is constituted by the through holes 51 and 61.

Figure 7:
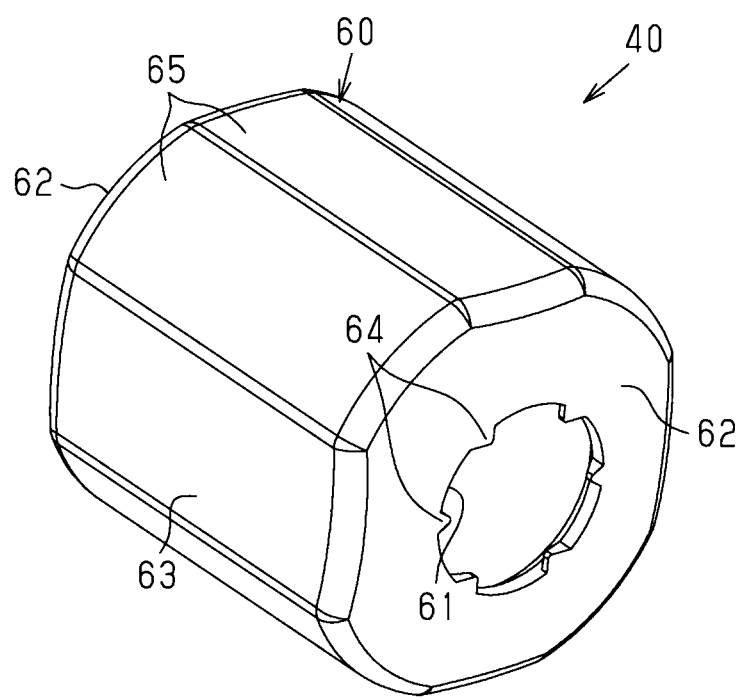
FIG. 7 is a schematic perspective view illustrating an electromagnetic wave absorption member according to the embodiment.

As shown in FIG. 7, the case 60 is formed, for example, in a polygonal ring shape. The case 60 of the present embodiment is formed in an octagonal ring shape. As shown in FIG. 5, the transverse cross section of the case 60 has, for example, a polygonal shape with a number of sides equal to or greater than that of a square. The transverse cross section of the case 60 of the present embodiment has an octagon shape.

As shown in FIG. 7, the case 60 includes, for example, a pair of side walls 62 that are located at opposite ends of the case 60 in the axial direction thereof, and extend in the radial direction of the case 60, and a circumferential wall 63 that extends in the circumferential direction and axial direction of the case 60.

The side walls 62 are formed in, for example, a polygonal shape when seen in the direction in which the through hole 61 passes. The side walls 62 of the present embodiment are formed in an octagon shape when seen in the direction in which the through hole 61 passes. The through hole 61 is formed in the side walls 62 while penetrating the side walls 62 in the axial direction. As shown in FIG. 6, the inner circumferential shape of the through hole 61 conforms to the outer circumferential shape of the covering member 26, for example. The inner circumferential shape of the through hole 61 conforms to the outer circumferential shape of the ring-shaped protrusions 27 of the covering member 26, for example. The through hole 61 of the present embodiment is formed in a circular shape when seen in the direction in which the through hole 61 passes.

Each of the side walls 62 includes, for example, latching portions 64 that is fitted into a ring-shaped recess 28 of the covering member 26. For example, the latching portions 64 are provided so as to latch to ring-shaped protrusions 27 in the length direction of the covering member 26. Due to the latching portions 64 and the ring-shaped protrusions 27 latching on each other, it is possible to restrict movement of the case 60 in the length direction of the covering member 26.

The leading end surfaces of the latching portions 64 are formed so as to be in contact with the outer circumferential surface of a ring-shaped recess 28, for example. The latching portions 64 are sandwiched between the side surfaces of ring-shaped protrusions 27 from two sides in the length direction. The latching portions 64 are opposed to, for example, the side surfaces of the ring-shaped protrusions 27. The latching portions 64 are in contact with the side surfaces of the ring-shaped protrusions 27, for example.

As shown in FIG. 7, the latching portions 64 are formed so as to protrude from the inner circumferential surface of the through hole 61 to the inside of the case 60 in the radial direction, for example. A plurality of (six in this example) latching portions 64 are formed on the inner circumferential surface of the through hole 61 at predetermined intervals in the circumferential direction of the through hole 61, for example. Note that the latching portions 64 may be formed successively throughout the circumferential direction of the through hole 61, for example.

The circumferential wall 63 is formed so as to extend in the axial direction of the case 60 between the pair of side walls 62, for example. The circumferential wall 63 is constituted by, for example, a plurality of (eight in this example) wall portions 65. For example, the circumferential wall 63 is constituted by eight wall portions 65 that corresponds to the sides of the octagonal side walls 62. The eight wall portions 65 are contiguous with each other, and are formed as a single piece.

As shown in FIG. 6, the case 60 includes a housing portion 66 (housing) in which the magnetic substance core 50 is housed. The housing portion 66 has a dimension such that it can house the magnetic substance core 50. The housing portion 66 is formed so as to be in communication with the through hole 61, for example. The housing portion 66 is formed by, for example, a space enclosed by the inner circumferential surfaces of the side walls 62 and the inner circumferential surface of the circumferential wall 63 (wall portions 65). The housing portion 66 is formed so as to surround the outer circumferential surface 50A of the magnetic substance core 50, for example. The inner circumferential surfaces of the wall portions 65 are formed so as to oppose the outer circumferential surface 50A of the magnetic substance core 50, for example. The housing portion 66 is formed so as to surround the side surfaces 50B of the magnetic substance core 50, for example. The inner circumferential surfaces of the side walls 62 are formed so as to oppose the side surfaces 50B of the magnetic substance core 50.

By fitting the latching portions 64 into ring-shaped recesses 28 of the covering member 26 in a state in which the magnetic substance core 50 is housed in the housing portion 66, the case 60 of the present embodiment is attached to the outer circumference of the covering member 26. At this time, the magnetic substance core 50 is held by, for example, the housing portion 66 of the case 60 and the outer circumferential surface of the covering member 26. Note that the electromagnetic wave absorption member 40 of the present embodiment is fixed to the outer circumference of the covering member 26, only by bringing the latching portions 64 of the case 60, and the ring-shaped recesses 28 and the ring-shaped protrusions 27 of the covering member 26 in a latched state. That is, the electromagnetic wave absorption member 40 of the present embodiment does not include a fixing member such as a tape member or a cable tie for fixing the electromagnetic wave absorption member 40 to the outer circumference of the covering member 26.

For example, the case 60 may include a slit extending in the axial direction of the case 60, or may not include such a slit extending in the axial direction of the case 60. The case 60 may be formed by a single component, or the case 60 may be formed by a combination of a plurality of components.

Note that examples of the material of the case 60 include an insulating material such as a synthetic resin. As the material of the case 60, it is possible to use, for example, a synthetic resin such as polyolefin, polyamide, polyester, and an ABS resin.

Configuration of Protector 70

As shown in FIG. 2, the protector 70 is formed so as to house a portion of the wires 21 in the length direction, and house a portion of the wires 31 in the length direction, for example. The protector 70 includes, for example, a protector main body 71, and a cover 90 that is attached to the protector main body 71. In the protector 70 of the present embodiment, the protector main body 71 and the cover 90 are formed as separate members. The cover 90 is formed so as to be detachable from the protector main body 71, for example. Examples of the materials of the protector main body 71 and the cover 90 include an insulating material such as a synthetic resin. As the materials of the protector main body 71 and the cover 90, it is possible to use a synthetic resin such as polyolefin, polyamide, polyester, and an ABS resin. For example, the material of the protector main body 71 and the material of the cover 90 may be the same material, or may be different materials.

Schematic Configuration of Protector Main Body 71

The protector main body 71 includes, for example, a bottom wall portion 72, and a pair of side wall portions 73 and 74 that protrude from two sides of the bottom wall portion 72 in the width direction thereof upward in the drawing. The bottom wall portion 72 and the side wall portions 73 and 74 form, for example, a route 80 whose cross section has the shape of a recess, and through which the electrical conduction paths 20 and 30 are passed. That is, the route 80 is formed by a space enclosed by the bottom wall portion 72 and the side wall portions 73 and 74. The route 80 is, for example, groove-shaped, and is formed so as to pass through the protector main body 71 in the length direction of the wires 21 and 31. The route 80 has an insertion hole 80A that is open in a direction (upward direction of the drawing in this example) that intersects with the length direction of the wires 21 and 31, for example. That is, the pair of side wall portions 73 and 74 are not connected to each other at their upper end portions opposite to the bottom wall portion 72. For example, the plurality of wires 21 and the plurality of wires 31 are passed through the route 80. The pair of side wall portions 73 and 74 are opposed to each other with a space (i.e., the route 80) in which the electrical conduction paths 20 and 30 are housed interposed therebetween, for example. The side wall portions 73 and 74 include, on the outer circumferential surfaces thereof, one or more lock portions 75, for example.

Configuration of Cover 90

The cover 90 is attached to the protector main body 71 so as to cover the insertion hole 80A of the route 80, for example. The cover 90 is attached to the protector main body 71 so as to cover the entire insertion hole 80A, for example.

The cover 90 includes, for example, an opposing wall 91 that is opposes the bottom wall portion 72 and the side wall portions 73 and 74, and one or more lock portions 92 formed on the inner circumferential surface (underside in this example) of the opposing wall 91. The cover 90 of the present embodiment is a single component obtained by integrating the opposing wall 91 and the lock portion 92 together.

The opposing wall 91 is formed, for example, in a flat plate shape. The opposing wall 91 is formed so as to cover the entire upper surface of the protector main body 71, for example. For example, the opposing wall 91 is provided so as to oppose the upper surface of the bottom wall portion 72, and the upper surfaces of the side wall portions 73 and 74.

The lock portions 92 are formed so as to protrude downward from the underside of the opposing wall 91, for example. The lock portions 92 correspond to, for example, the lock portions 75 formed on the protector main body 71. As a result of, for example, the lock portions 92 being caught by the lock portions 75, the cover 90 is fixed to the protector main body 71 while closing the insertion hole 80A of the route 80, for example. With this, the cover 90 can keep the insertion hole 80A closed.

Specific Configuration of Route 80

The route 80 includes, for example, a pair of collective housing portions 81 and 82 (collective housings) respectively provided at opposite ends thereof in the length direction, a housing portion 83 that is provided between the pair of collective housing portions 81 and 82, and in which the electrical conduction path 20 is housed, and a wire housing portion 84 (wire housing) that is provided between the pair of collective housing portions 81 and 82, and in which the electrical conduction path 30 is housed.

Configuration of Collective Housing Portion 81

The collective housing portion 81 is formed so as to collectively house the electrical conduction path 20 and the electrical conduction path 30, for example. Here, "to collectively house" as used in the present specification means to house, for example, the electrical conduction path 20 and the electrical conduction path 30 without a wall provided between the electrical conduction path 20 and the electrical conduction path 30. For example, the collective housing portion 81 is formed so as to collectively house the wires 21 and the wires 31. The collective housing portion 81 is formed by a space enclosed by the bottom wall portion 72, the side wall portion 73, and the side wall portion 74, for example. The collective housing portion 81 is, for example, groove-shaped, and is formed so as to pass through in the length direction of the wires 21 and 31. The collective housing portion 81 is formed so as to be open upward in the drawing, for example. The collective housing portion 81 functions as a collective housing portion that cooperates with the cover 90 attached to the protector main body 71 to cover the opening of the collective housing portion 81, and collectively surrounds the outer circumferences of the wires 21 and 31, for example.

The collective housing portion 81 includes, for example, a small width portion A1 that is small in width, and a large width portion A2 that has a larger width than that of the small width portion A1. In the small width portion A1, for example, the plurality of wires 21 and the plurality of wires 31 are housed in a state of being stacked on each other. For example, one end of the large width portion A2 is in communication with the small width portion A1, and the other end of the large width portion A2 is in communication with the housing portion 83 and the wire housing portion 84. The large width portion A2 is formed such that its width increases from the small width portion A1. In the large width portion A2, for example, the electrical conduction path 20 and the electrical conduction path 30 are housed in a state of being disposed side by side in the width direction of the large width portion A2, that is, in a direction in which the pair of side wall portions 73 and 74 are arranged in parallel to each other. The collective housing portion 81 is formed, for example, such that the routing direction of the electrical conduction paths 20 and 30 is bent between the small width portion A1 and the large width portion A2.

Configuration of Collective Housing Portion 82

The collective housing portion 82 is formed so as to collectively house the electrical conduction path 20 and the electrical conduction path 30, for example. For example, the collective housing portion 82 is formed so as to collectively house the wires 21 and the wires 31. The collective housing portion 82 is formed by a space enclosed by the bottom wall portion 72, the side wall portion 73, and the side wall portion 74, for example. The collective housing portion 82 is, for example, groove-shaped, and is formed so as to pass through in the length direction of the wires 21 and 31. The collective housing portion 82 is formed so as to be open upward in the drawing, for example. The collective housing portion 82 functions as a collective housing portion that cooperates with the cover 90 attached to the protector main body 71 to cover the opening of the collective housing portion 82, and collectively surrounds the outer circumferences of the wires 21 and 31, for example.

The collective housing portion 82 includes, for example, a small width portion B1 that is small in width, and a large width portion B2 that has a larger width than that of the small width portion B1. In the small width portion B1, for example, the plurality of wires 21 and the plurality of wires 31 are housed in a state of being stacked on each other. For example, one end of the large width portion B2 is in communication with the small width portion B1, and the other end of the large width portion B2 is in communication with the housing portion 83 and the wire housing portion 84. The large width portion B2 is formed such that its width increases from the small width portion B1. In the large width portion B2, for example, the electrical conduction path 20 and the electrical conduction path 30 are housed in a state of being disposed side by side in the width direction of the large width portion B2, that is, in a direction in which the pair of side wall portions 73 and 74 are arranged in parallel to each other. The collective housing portion 82 is formed, for example, such that the routing direction of the electrical conduction paths 20 and 30 is bent between the small width portion B1 and the large width portion B2.

Configuration of Housing Portion 83

As shown in FIGS. 2 and 3, the housing portion 83 is adjacent to, for example, the collective housing portion 81 in the length direction of the wires 21. The housing portion 83 is adjacent to, for example, the collective housing portion 82 in the length direction of the wires 21. For example, the housing portion 83 is arranged between the large width portion A2 of the collective housing portion 81 and the large width portion B2 of the collective housing portion 82. For example, one end of the housing portion 83 in the length direction is in communication with the large width portion A2, and the other end of the housing portion 83 in the length direction is in communication with the large width portion B2. The housing portion 83 is provided so as to separately house the electrical conduction path 20, out of the electrical conduction paths 20 and 30, for example. The electrical conduction path 20 is housed in the housing portion 83 so as to pass through the housing portion 83, for example. For example, the wires 21 are housed in the protector main body 71 so as to pass through the housing portion 83. The housing portion 83 is provided so as to house, for example, the electromagnetic wave absorption member 40 mounted on the outer circumference of the electrical conduction path 20. The housing portion 83 has a dimension such that it can house the electromagnetic wave absorption member 40 as a whole, for example. The housing portion 83 is provided so as to house, for example, a portion of the covering member 26 drawn from the opposite ends of the electromagnetic wave absorption member 40 in the length direction. For example, the housing portion 83 is a portion, from among the housing portion 83 and the wire housing portion 84, that is arranged further away from the small width portion A1 of the collective housing portion 81.

The housing portion 83 includes, for example, wall portions 85 and 86 (first and second walls) that extend in a direction that intersects with the length direction of the wires 21, and are disposed at a predetermined interval in the length direction of the wires 21. The housing portion 83 includes, for example, a partition wall 87 that extends in the length direction of the wires 21, and a side wall portion 88 that extends in the length direction of the wires 21, and is disposed at a predetermined distance to the partition wall 87 in the direction that intersects with the length direction of the wires 21. The partition wall 87 and the side wall portion 88 are arranged between the wall portion 85 and the wall portion 86, for example. The partition wall 87 is formed so as to connect the wall portion 85 and the wall portion 86, for example. The side wall portion 88 is formed so as to connect the wall portion 85 and the wall portion 86, for example. The wall portions 85 and 86, the partition walls 87, and the side wall portion 88 are formed so as to extend upward from the upper surface of the bottom wall portion 72, for example.

The housing portion 83 is formed by a space enclosed by the wall portions 85 and 86, the partition wall 87, the side wall portion 88, and the bottom wall portion 72, for example. The housing portion 83 is, for example, groove-shaped, and is formed so as to pass through in the length direction of the wires 21. The housing portion 83 has, for example, a rectangular planar shape as a whole when seen from above.

Configurations of Wall Portions 85 and 86

The wall portions 85 and 86 are formed so as to extend in a direction that intersects with the length direction of the wires 21, namely, a direction that is parallel to the direction in which the pair of side wall portions 73 and 74 are in parallel to each other, for example. The wall portions 85 and 86 are respectively provided at the opposite ends of the housing portion 83 in the length direction, for example. The wall portion 85 is formed so as to separate the housing portion 83 from the collective housing portion 81, for example. The wall portion 86 is formed so as to separate the housing portion 83 from the collective housing portion 82, for example. The wall portions 85 and 86 are provided so as to oppose, for example, the electromagnetic wave absorption member 40 housed in the housing portion 83. For example, the wall portion 85 is provided so as to oppose one side wall 62 of the case 60, and the wall portion 86 is provided so as to oppose the other side wall 62 of the case 60.

Configuration of Wall Portion 85

As shown in FIG. 3, the wall portion 85 has, for example, a through hole 85X that penetrates the wall portion 85 in the length direction of the wires 21. The wall portion 85 is constituted by a pair of wall portions 85A and 85B (third wall), which are provided at a predetermined interval in a direction that intersects with the length direction of the wires 21, for example. The pair of wall portions 85A and 85B are arranged so as to oppose each other with the through hole 85X interposed therebetween, for example. The through hole 85X has a dimension such that, for example, the covering member 26 can pass therethrough, but the case 60 of the electromagnetic wave absorption member 40 cannot pass therethrough.

Figure 4:
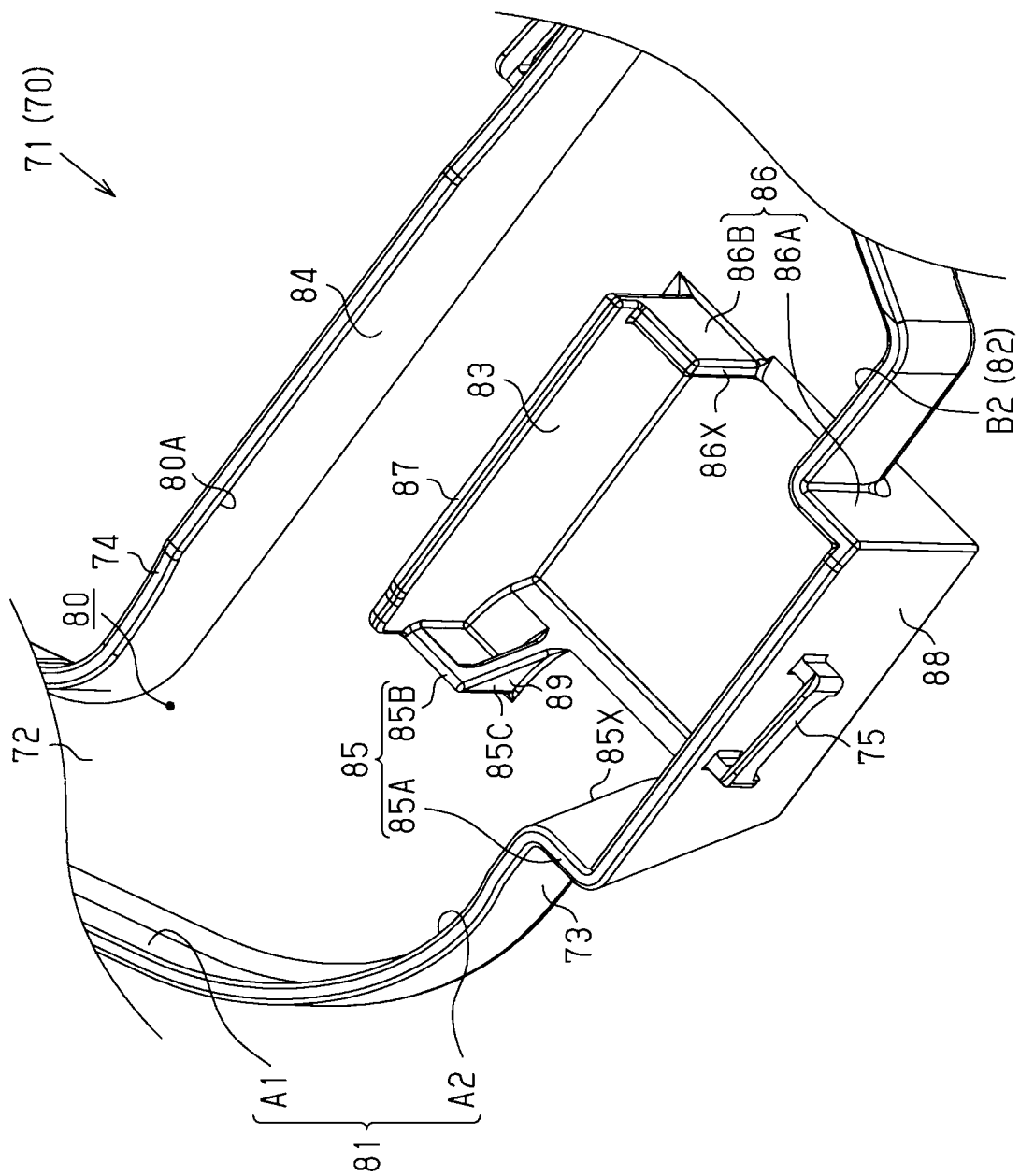
FIG. 4 is a schematic perspective view illustrating a protector according to the embodiment.

As shown in FIG. 4, the wall portion 85A constitutes, for example, a part of the side wall portion 73 of the protector main body 71. The wall portion 85A is coupled to, for example, the side wall portion 73 that constitutes the collective housing portion 81. The wall portion 85A is coupled to, for example, the side wall portion 88. The wall portion 85A is formed so as to extend, for example, in a direction that is orthogonal to the direction in which the side wall portion 73 constituting the collective housing portion 81, and the side wall portion 88 extend. The upper surface of the wall portion 85A lies in the same plane as the upper surface of the side wall portion 73 constituting the collective housing portion 81, and the upper surface of the side wall portion 88, for example.

The wall portion 85B is coupled to, for example, the partition wall 87. For example, the wall portion 85B is a partition wall, from among the wall portions 85A and 85B, that is provided closer to the small width portion A1 of the collective housing portion 81. The wall portion 85B is lower than the wall portion 85A, for example. The wall portion 85B is lower than the partition wall 87, for example. The upper surface of the wall portion 85B is formed at a position that is lower than the upper surface of the wall portion 85A, that is, a position that is closer to the bottom wall portion 72, for example.

An extended surface 89 is coupled to a side surface 85C of the wall portion 85B that constitutes the inner surface of the through hole 85X, for example. The inner surface of the through hole 85X includes, for example, the side surface 85C of the wall portion 85B, and the extended surface 89. The extended surface 89 is formed, for example, so as to extend from the side surface 85C of the wall portion 85B in the length direction of the wires 21 (see FIG. 3). The extended surface 89 is formed so as to extend from the side surface 85C of the wall portion 85B to the wall portion 86, for example. The extended surface 89 is contiguous with the side surface 85C, and they are formed together as a single piece, for example. The side surface 85C and the extended surface 89 are arranged so as to oppose the wall portion 85A, for example. The side surface 85C and the extended surface 89 are arranged so as to oppose the side wall portion 73, for example. The side surface 85C and the extended surface 89 are arranged so as to oppose the electrical conduction path 20 housed in the housing portion 83 (see FIG. 3), for example. The side surface 85C and the extended surface 89 are formed such that, for example, their widths increases as approaching from the upper end to the lower end. The extended surface 89 is formed such that, for example, its width increases toward the wall portion 86 side as approaching from the upper end to the lower end. The sizes of the side surface 85C and the extended surface 89 in the length direction of the wires 21 are larger than the size of the wall portion 85B in the length direction of the wires 21, for example.

Configuration of Wall Portion 86

As shown in FIG. 3, the wall portion 86 has, for example, a through hole 86X that penetrates the wall portion 86 in the length direction of the wires 21. The wall portion 86 is constituted by a pair of wall portions 86A and 86B, which are provided at a predetermined interval in a direction that intersects with the length direction of the wires 21, for example. The pair of wall portions 86A and 86B are provided so as to oppose each other with the through hole 86X interposed therebetween, for example. The through hole 86X has a dimension such that, for example, the covering member 26 can pass therethrough, but the case 60 of the electromagnetic wave absorption member 40 cannot pass therethrough.

The wall portion 86A constitutes, for example, a part of the side wall portion 73 of the protector main body 71. The wall portion 86A is coupled to, for example, the side wall portion 73 that constitutes the collective housing portion 82. The wall portion 86A is coupled to, for example, the side wall portion 88. The wall portion 86A is formed so as to extend, for example, in a direction that is orthogonal to the direction in which the side wall portion 73 constituting the collective housing portion 82, and the side wall portion 88 extend. The upper surface of the wall portion 86A lies in the same plane as the upper surface of the side wall portion 73 constituting the collective housing portion 82, and the upper surface of the side wall portion 88, for example.

The wall portion 86B is coupled to, for example, the partition wall 87. The wall portion 86B is lower than the wall portion 86A, for example. The wall portion 86B is lower than the partition wall 87, for example. The upper surface of the wall portion 86B is formed at a position that is lower than the upper surface of the wall portion 86A, that is, a position that is closer to the bottom wall portion 72, for example.

Configuration of Partition Wall 87

The partition wall 87 is provided, for example, between the wall portion 85B and the wall portion 86B. The partition wall 87 is formed so as to connect the wall portion 85B and the wall portion 86B, for example. For example, one end of the partition wall 87 in the length direction of the wires 21 is coupled to the wall portion 85B, and the other end thereof in the length direction of the wires 21 is coupled to the wall portion 86B. The partition wall 87 is provided so as to separate the housing portion 83 from the wire housing portion 84, for example. The partition wall 87 is provided, for example, between the side wall portion 88 and the side wall portion 74. The partition wall 87 is provided so as to oppose the side wall portion 88 and oppose the side wall portion 74, for example. The partition wall 87 is provided so as to oppose the electromagnetic wave absorption member 40 housed in the housing portion 83, for example. The partition wall 87 is provided so as to so as to oppose the circumferential wall 63 of the case 60, for example.

Configuration of Side Wall Portion 88

The side wall portion 88 constitutes, for example, a part of the side wall portion 73 of the protector main body 71. The side wall portion 88 is provided, for example, between the wall portion 85A and the wall portion 86A. The side wall portion 88 is formed so as to connect the wall portion 85A and the wall portion 86A, for example. For example, one end of the side wall portion 88 in the length direction of the wires 21 is coupled to the wall portion 85A, and the other end thereof in the length direction of the wires 21 is coupled to the wall portion 86A. The side wall portion 88 is provided so as to oppose the electromagnetic wave absorption member 40 housed in the housing portion 83, for example. The side wall portion 88 is provided so as to oppose the circumferential wall 63 of the case 60, for example.

Regarding Relationship between Housing Portion 83 and Electrical Conduction Path 20

The electrical conduction path 20 is routed in the protector 70 so that, for example, the electromagnetic wave absorption member 40 is housed in the housing portion 83. For example, the electromagnetic wave absorption member 40 as a whole is housed in the housing portion 83. When the electromagnetic wave absorption member 40 is housed in the housing portion 83 for example, one side wall 62 of the case 60 is opposed to the wall portions 85A and 85B, and the other side wall 62 of the case 60 is opposed to the wall portions 86A and 86B. Accordingly, the wall portions 85A, 85B, 86A, and 86B can suppress the electromagnetic wave absorption member 40 from moving in the length direction of the wires 21. Also, when the electromagnetic wave absorption member 40 is housed in the housing portion 83 for example, the circumferential wall 63 of the case 60 is opposed to the partition wall 87, and the circumferential wall 63 is opposed to the side wall portion 88. Accordingly, the partition wall 87 and the side wall portion 88 can suppress the electromagnetic wave absorption member 40 from moving in a direction that intersects with the length direction of the wires 21.

The dimension of the covering member 26 in the length direction is set, for example, to be larger than a distance between the wall portion 85 and the wall portion 86. The covering member 26 is formed so as to pass through the wall portion 85 as well as the wall portion 86, for example. For example, the covering member 26 is formed so as to pass through the through hole 85X of the wall portion 85, as well as the through hole 86X of the wall portion 86. For example, the covering member 26 drawn from the case 60 to the collective housing portion 81 side is formed so as to pass through the through hole 85X of the wall portion 85, and extend to the large width portion A2 of the collective housing portion 81. Accordingly, the wires 21 are passed through the through hole 85X of the wall portion 85 with the outer circumferences of the wires 21 covered by the covering member 26. Accordingly, it is possible to prevent the wall portions 85A and 85B constituting the wall portion 85 from coming into contact with the outer circumferential surfaces of the wires 21. The covering member 26 drawn from the case 60 to the collective housing portion 82 side is formed, for example, so as to pass through the through hole 86X of the wall portion 86, and extend to the large width portion B2 of the collective housing portion 82. Accordingly, the wires 21 are passed through the through hole 86X of the wall portion 86 with the outer circumferences of the wires 21 covered by the covering member 26. Accordingly, it is possible to prevent the wall portions 86A and 86B constituting the wall portion 86 from coming into contact with the outer circumferential surfaces of the wires 21.

The covering member 26 of the present embodiment is formed so as to extend from the large width portion A2 to the large width portion B2 through the housing portion 83. For example, one end of the covering member 26 in the length direction is fixed to the outer circumferences of the wires 21 using the fixing member 29 in the large width portion A2, and the other end thereof in the length direction is fixed to the outer circumferences of the wires 21 using the fixing member 29 in the large width portion B2.

As shown in FIG. 5, the housing portion 83 is groove-shaped. The housing portion 83 is formed so as to be open in a direction (upward in the drawing in this example) that intersects with the length direction of the wires 21, for example. In the protector 70, as a result of, for example, the cover 90 being attached to the protector main body 71 to cover the opening of the housing portion 83, a housing portion 100 that surrounds the outer circumference of the electromagnetic wave absorption member 40 is realized. The housing portion 100 is constituted by the housing portion 83, and the cover 90 that covers the opening of the housing portion 83, for example. The housing portion 100 has a height H1 set to be smaller than a diagonal dimension L2, in a transverse cross section, of the case 60 of the electromagnetic wave absorption member 40, for example. Also, the housing portion 100 has a width W1 that is set to be smaller than the diagonal dimension L2 of the case 60, for example. Note here that, in the present specification, the height H1 of the housing portion 100 is equal to, for example, the shortest distance between the upper surface of the bottom wall portion 72 and the underside of the opposing wall 91 of the cover 90. The width W1 of the housing portion 100 is equal to, for example, the shortest distance between the partition wall 87 and the side wall portion 88. Also, the diagonal dimension L2 of the case 60 is equal to, for example, the dimension of the longest one of the diagonals in the transverse cross section of the case 60.

Configuration of Wire Housing Portion 84

As shown in FIGS. 2 and 3, the wire housing portion 84 is adjacent to, for example, the collective housing portion 81 in the length direction of the wires 31. The wire housing portion 84 is adjacent to, for example, the collective housing portion 82 in the length direction of the wires 31. The wire housing portion 84 is provided, for example, between the large width portion A2 of the collective housing portion 81 and the large width portion B2 of the collective housing portion 82. The wire housing portion 84 is provided so as to separately house the electrical conduction path 30, out of the electrical conduction paths 20 and 30, for example. The wire housing portion 84 is provided so as to collectively house the plurality of wires 31, for example. For example, the wires 31 are housed in the protector main body 71 so as to pass through the wire housing portion 84. For example, the wire housing portion 84 is a portion, from among the housing portion 83 and the wire housing portion 84, that is arranged closer to the small width portion A1 of the collective housing portion 81.

The wire housing portion 84 is provided, for example, in parallel to the housing portion 83. For example, the wire housing portion 84 is provided in parallel to the housing portion 83 with the partition wall 87 interposed therebetween. The wire housing portion 84 is formed by a space enclosed by the partition wall 87, the side wall portion 74, and the bottom wall portion 72, for example.

As shown in FIG. 5, the wire housing portion 84 is, for example, groove-shaped, and is formed so as to pass through in the length direction of the wires 31. The wire housing portion 84 is formed so as to be open in a direction (upward in the drawing in this example) that intersects with the length direction of the wires 31, for example. In the protector 70, as a result of, for example, the cover 90 being attached to the protector main body 71 to cover the opening of the wire housing portion 84, a wire housing portion 101 that surrounds the outer circumferences of the wires 31 is realized. The wire housing portion 101 is constituted by the wire housing portion 84, and the cover 90 that covers the opening of the wire housing portion 84, for example.

Note that, as shown in FIG. 1, the wires 21 drawn from the protector 70 are housed in the exterior member 25, and the wires 31 drawn from the protector 70 are housed in the exterior member 35.

Hereinafter, functions and effects of the present embodiment will be described.

(1) The wire harness 10 includes: a wire 21, a covering member 26 that covers an outer circumference of a portion of the wire 21 in a length direction thereof; an electromagnetic wave absorption member 40 mounted on an outer circumference of the covering member 26; and a fixing member 29 that fixes one end portion of the covering member 26 in a length direction thereof to the wire 21. The electromagnetic wave absorption member 40 includes a ring-shaped magnetic substance core 50, and a ring-shaped case 60 in which the magnetic substance core 50 is housed. The covering member 26 includes, on the outer circumferential surface thereof, ring-shaped protrusions 27 and ring-shaped recesses 28. The case 60 includes a latching portion 64 that latches to the ring-shaped protrusions 27 in the length direction of the covering member 26.

With this configuration, as a result of the ring-shaped protrusions 27 of the covering member 26 latching to the latching portion 64 of the case 60, it is possible to suppress the electromagnetic wave absorption member 40 from moving in the length direction of the covering member 26. Thus, it is possible to suppress positional displacement of the electromagnetic wave absorption member 40 in the length direction of the covering member 26.

(2) Also, since the electromagnetic wave absorption member 40 is mounted on the outer circumference of the covering member 26 that covers the outer circumference of the wire 21, the covering member 26 is interposed between the wire 21 and the electromagnetic wave absorption member 40. Thus, it is possible to prevent the electromagnetic wave absorption member 40 from coming into direct contact with the outer circumferential surface of the wire 21. This can prevent the wire 21 from being damaged due to coming into contact with the electromagnetic wave absorption member 40.

(3) Furthermore, since the covering member 26 is provided only in a portion of the wire 21 in the length direction, it is possible to reduce the length of the covering member 26 compared to a case where the covering member 26 is provided over the entire length of the wire 21 in the length direction. Thus, it is possible to reduce the cost of the covering member 26, and improve the workability when the covering member 26 is attached to the wire 21.

(4) The electromagnetic wave absorption member 40 is housed in the protector 70. Accordingly, the electromagnetic wave absorption member 40 can be held by the protector 70. This can suppress the electromagnetic wave absorption member 40 from vibrating due to, for example, a vibration caused by the vehicle traveling, or the like. As a result, it is possible to suppress the damage of the wire 21 that may be caused by the vibration of the electromagnetic wave absorption member 40.

(5) The protector 70 is provided so as to surround the outer circumference of the electromagnetic wave absorption member 40. Accordingly, the electromagnetic wave absorption member 40 can be protected by the protector 70. For example, the protector 70 can be interposed between the electromagnetic wave absorption member 40 and surrounding members thereof, and thus it is possible to prevent the electromagnetic wave absorption member 40 from coming into direct contact with the surrounding members. As a result, it is possible to prevent generation of abnormal noise or damage of the electromagnetic wave absorption member 40 that may be caused due to the electromagnetic wave absorption member 40 and the surrounding members coming into contact with each other.

(6) The housing portion 83 includes the wall portions 85 and 86 that are arranged at an interval in the length direction of the wire 21, and are opposed to the electromagnetic wave absorption member 40. With this configuration, it is possible to restrict, using the wall portions 85 and 86, the electromagnetic wave absorption member 40 from moving in the length direction of the wire 21 in the housing portion 83 of the protector 70. It is thus possible to restrict the movement of the electromagnetic wave absorption member 40 within the protector 70. As a result, it is possible to suppress generation of abnormal noise or damage of the electromagnetic wave absorption member 40 that may be caused due to the electromagnetic wave absorption member 40 and the protector 70 coming into contact with each other.

(7) The covering member 26 is formed so as to pass through the wall portion 85, and pass through the wall portion 86. With this configuration, the wire 21 is passed through the wall portion 85 while being covered by the covering member 26, and is passed through the wall portion 86 while being covered by the covering member 26. Thus, the covering member 26 can be interposed between the outer circumferential surface of the wire 21, and the wall portion 85, and can be interposed between the outer circumferential surface of the wire 21, and the wall portion 86. Therefore, it is possible to prevent the wall portions 85 and 86 from coming into direct contact with the outer circumferential surface of the wire 21. As a result, it is possible to prevent the wire 21 from being damaged due to coming into contact with the wall portions 85 and 86.

(8) The protector 70 includes the wire housing portion 84 that is separated from the housing portion 83 by the partition wall 87, and is arranged side by side with the housing portion 83. Also, the wire 21 and the electromagnetic wave absorption member 40 are housed in the housing portion 83, and the wire 31 is housed in the wire housing portion 84. Accordingly, the electromagnetic wave absorption member 40 and the wire 31 can be separately housed in the housing portion 83 and the wire housing portion 84 that are separated from each other by the partition wall 87. Since the partition wall 87 can be interposed between the wire 31 and the electromagnetic wave absorption member 40 in this way, the electromagnetic wave absorption member 40 can be prevented from coming into direct contact with the outer circumferential surface of the wire 31. As a result, it is possible to prevent the wire 31 from being damaged due to coming into contact with the electromagnetic wave absorption member 40.

(9) The inner surface of the through hole 85X of the wall portion 85 includes the side surface 85C of the wall portion 85B coupled to the partition wall 87, and the extended surface 89. With this configuration, it is possible to make the inner surface of the through hole 85X larger in the surface area, relative to a case where the inner surface of the through hole 85X is constituted only by the side surface 85C of the wall portion 85B. Accordingly, when the wire 21 is routed from the collective housing portion 81 to the housing portion 83, the outer circumferential surface of the covering member 26 that covers the outer circumference of this wire 21 can be suitably brought into areal contact with the inner surface of the through hole 85X. For example, even if the wire 21 is bent at a sharp angle when being routed from the collective housing portion 81 to the housing portion 83, the outer circumferential surface of the covering member 26 can be suitably brought into areal contact with the inner circumferential surface of the through hole 85X. As a result, it is possible to suppress the damage of the outer circumferential surface of the covering member 26 that may be caused by the covering member 26 coming into contact with the inner surface of the through hole 85X more suitably than in a case where the inner surface of the through hole 85X comes into point or line contact with the outer circumferential surface of the covering member 26.

(10) The housing portion 83 is formed with a height H1 and a width W1 that are smaller than the diagonal dimension L2 in the transverse cross section of the case 60. With this configuration, even if, in the housing portion 83, the case 60 is rotated around the central axis of the case 60 serving as an axis of rotation, the outer circumferential surface of the case 60 can be brought into contact with the inner circumferential surface of the housing portion 83. Thus, it is possible to suitably suppress the rotation of the case 60 within the housing portion 83. As a result, it is possible to suppress the damage of the wire 21 that may be caused by the rotation of the case 60.

OTHER EMBODIMENTS

The above-described embodiment can be implemented with the following modifications. The above-described embodiment and the following modifications can be implemented in combination with each other as long as there are no technical discrepancies.

- In the above-described embodiment, the covering member 26 is provided only inside the protector 70, but the present disclosure is not limited thereto. For example, the covering member 26 may be formed so as to be drawn from an end portion of the protector 70 in the length direction.
- In the above-described embodiment, the covering member 26 is provided so as to pass through the wall portion 85, but the present disclosure is not limited thereto. For example, a configuration is also possible in which the wires 21 drawn from the covering member 26 pass through the wall portion 85.
- In the above-described embodiment, the covering member 26 is provided so as to pass through the wall portion 86, but the present disclosure is not limited thereto. For example, a configuration is also possible in which the wires 21 drawn from the covering member 26 pass through the wall portion 86.

In the above-described embodiment, the housing portions 83 and 100 are provided in an intermediate portion of the protector 70 in the length direction, but the present disclosure is not limited thereto. For example, the housing portions 83 and 100 may be provided at one end of the protector 70 in the length direction. In this case, for example, the collective housing portion 81 or the collective housing portion 82 is omitted.

The wire housing portions 84 and 101 may be omitted from the protector 70 of the above-described embodiment.

The protector 70 of the above-described embodiment may be configured to house only the electrical conduction path 20.

In the above-described embodiment, a dampening member may also be provided between the protector 70 and the case 60 of the electromagnetic wave absorption member 40.

The protector 70 of the above-described embodiment may also include a clip for fixation to the vehicle.

In the above-described embodiment, the protector main body 71 and the cover 90 are formed as separate members, but the present disclosure is not limited thereto. For example, it is also possible to employ a configuration in which a cover different from the cover 90 is formed as a single piece with the protector main body 71 via a hinge part or the like.

The cover 90 of the above-described embodiment may be omitted.

The protector 70 of the above-described embodiment may be omitted.

In the above-described embodiment, the covering member 26 is implemented as a corrugated tube made of a synthetic resin, but the present disclosure is not limited thereto. For example, the covering member 26 may be implemented as a corrugated tube made of a metal.

In the above-described embodiment, the covering member 26 is implemented as a corrugated tube that includes, on the outer circumferential surface thereof, the ring-shaped protrusions 27 and the ring-shaped recesses 28, serving as the first latching portions, but the covering member 26 may also be implemented as an exterior member other than the corrugated tube. For example, other structures of the covering member 26 are not particularly limited as long as it has a structure in which the first latching portions that latch to the latching portions 64, serving as the second latching portions/second latches, in the length direction of the covering member 26 are formed on the outer circumferential surface of the covering member 26.

The outer circumferential shape and the inner circumferential shape of the case 60 of the above-described embodiment are not particularly limited. For example, the case 60 may be formed in a circular ring.

In the above-described embodiment, the electromagnetic wave absorption member 40 is constituted by the magnetic substance core 50 and the case 60, but the present disclosure is not limited thereto. For example, a dampening member may also be provided between the outer circumferential surface 50A of the magnetic substance core 50 and the inner circumferential surface of the case 60.

In the above-described embodiment, the number of wires 21 that are housed in the exterior member 25 is two, but the number of wires 21 is not particularly limited, and may be changed according to the specification of the vehicle V. For example, the number of wires 21 that are housed in the exterior member 25 may be one, or three or more.

In the above-described embodiment, the number of wires 31 that are housed in the exterior member 35 is two, but the number of wires 31 is not particularly limited, and may be changed according to the specification of the vehicle V. For example, the number of wires 31 that are housed in the exterior member 35 may be one, or three or more.

In the above-described embodiment, the electrical conduction path 20 is constituted by the wires 21 and the exterior member 25, but the present disclosure is not limited thereto. For example, an electromagnetic shielding member may also be provided inside the exterior member 25. The electromagnetic shielding member is provided, for example, so as to collectively surround the plurality of wires 21. The electromagnetic shielding member is provided, for example, between the inner circumferential surface of the exterior member 25, and the outer circumferential surfaces of the wires 21. As the electromagnetic shielding member, it is possible to use, for example, a flexible braided wire or metal foil. As the braided wire, it is possible to use a braided wire formed by braiding a plurality of metal strands, or a braided wire formed by braiding metal strands and resin strands in combination. As the material of the metal strands, it is possible to use a copper-based or aluminum-based metal material, for example. As the resin strands, it is possible to use reinforced fibers having excellent insulation and shear resistance, such as para-aramid fibers.

In the above-described embodiment, the electrical conduction path 30 is constituted by the wires 31 and the exterior member 35, but the present disclosure is not limited thereto. For example, an electromagnetic shielding member may also be provided inside the exterior member 35. The electromagnetic shielding member is provided, for example, so as to collectively surround the plurality of wires 31. The electromagnetic shielding member is provided, for example, between the inner circumferential surface of the exterior member 35, and the outer circumferential surface of the wires 31. As the electromagnetic shielding member, it is possible to use, for example, a flexible braided wire or metal foil.

The wires 21 of the above-described embodiment may be replaced by shielded wires.

The wires 21 of the above-described embodiment may also be replaced by low-voltage wires.

The wires 31 of the above-described embodiment may be replaced by shielded wires.

The wires 31 of the above-described embodiment may also be replaced by high-voltage wires.

The electrical conduction path 30 of the above-described embodiment may be omitted.

The number and the installation position of electromagnetic wave absorption member 40 of the above-described embodiment are not particularly limited. For example, two or more electromagnetic wave absorption members 40 may be provided for the wire harness 10.

The arrangement relationship of the devices M1 to M4 of the vehicle V is not limited to that in the above-described embodiment, but may be changed as appropriate according to the vehicle configuration.

It should be appreciated that the embodiments disclosed herein are to be construed in all respects as illustrative and not limiting. The scope of the present disclosure is defined by the claims, rather than the description of the embodiment above, and is intended to include all modifications which fall within the scope of the claims and the meaning and scope of equivalents thereof.

What is claimed is:

1. A wire harness comprising:
a wire;
a cover that covers an outer circumference of a portion of the wire in a length direction, the cover including a first latch formed on an outer circumferential surface of the cover;
an electromagnetic wave absorber that is mounted on an outer circumference of the cover, the electromagnetic wave absorber including a ring-shaped magnetic substance core and a ring-shaped case in which the magnetic substance core is housed, and the case including a second latch that latches to the first latch in the length direction of the cover;
a fixing member that fixes one end of the cover to the wire in the length direction;
a protector that houses the wire, the protector including a protector housing in which the electromagnetic wave absorber is housed;
a wire housing that is provided side by side with the protector housing; and
a partition wall that separates the protector housing from the wire housing.

2. The wire harness according to claim 1, wherein:
the protector housing includes a first wall and a second wall which arranged at an interval in the length direction of the wire, that extend in a direction that intersects with the length direction of the wire, and
the first wall and the second wall are opposed to the electromagnetic wave absorber.

3. The wire harness according to claim 2, wherein the cover passes through the first wall, and passes through the second wall.

4. The wire harness according to claim 2, wherein:
the wire is a first wire, the wire harness further includes a second wire, which is different from the first wire,
the first wire passes through the protector housing, and the second wire passes through the wire housing.

5. The wire harness according to claim 4, wherein:
the protector further includes a collective housing in which the first wire and the second wire are collectively housed,
the collective housing is adjacent to the protector housing in the length direction of the first wire, and is adjacent to the wire housing in a length direction of the second wire,
the first wall is provided so as to separate the protector housing from the collective housing,
the first wall includes a first through hole through which the cover is passed and a third wall coupled to the partition wall, and
an inner surface of the first through hole includes a side surface of the third wall, and an extended surface that is formed continuously from the side surface, and the extended surface extends from the side surface toward the second wall in the length direction of the first wire.

6. The wire harness according to claim 1, wherein the cover is provided only inside the protector.

7. The wire harness according to claim 1, wherein:
the case has a transverse cross section having a polygonal shape with four or more sides,
the protector housing has a height set to be smaller than a diagonal length in a transverse cross section of the case, and
the protector housing has a width set to be smaller than the diagonal length.

8. The wire harness according to claim 1, wherein:
the cover is a corrugated tube having a bellows structure in which ring-shaped protrusions and ring-shaped recesses are alternately provided successively in an axial direction in which a central axis of the cover extends,
the case includes a pair of side walls provided at opposite ends of the case in an axial direction of the case, and a circumferential wall provided between the pair of side walls, and the circumferential wall extends in a circumferential direction and in the axial direction of the case,
each of the pair of side walls includes a through hole through which the cover is passed,
the second latch is formed protruding from an inner circumferential surface of the through hole inward in a radial direction of the case, and
the second latch is fitted into the ring-shaped recesses.

9. The wire harness according to claim 8, wherein
the second latch includes a plurality of second latches, and the inner circumferential surface of the through hole includes the plurality of second latches provided at intervals in a circumferential direction of the through hole.

* * * * *